(12) United States Patent
Wang et al.

(10) Patent No.: US 9,728,682 B2
(45) Date of Patent: Aug. 8, 2017

(54) LIGHT-EMITTING ELEMENT AND LIGHT-EMITTING DEVICE CONTAINING THE SAME

(71) Applicant: LEXTAR ELECTRONICS CORPORATION, Hsinchu (TW)

(72) Inventors: Te-Chung Wang, Taichung (TW); Shih-Huan Lai, Changhua (TW); Shiou-Yi Kuo, Kaoshiung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 15/199,477

(22) Filed: Jun. 30, 2016

(65) Prior Publication Data

US 2017/0012175 A1 Jan. 12, 2017

(30) Foreign Application Priority Data

Jul. 6, 2015 (TW) .............................. 104121808 A (51) Int. Cl.
| H01L 33/46 | (2010.01) |
| H01L 33/38 | (2010.01) |
| H01L 27/15 | (2006.01) |
| H01L 33/32 | (2010.01) |

(52) U.S. Cl.
CPC ............ *H01L 33/46* (2013.01); *H01L 27/156* (2013.01); *H01L 33/32* (2013.01); *H01L 33/38* (2013.01)

(58) Field of Classification Search
None
See application file for complete search history.

(56) References Cited

U.S. PATENT DOCUMENTS

2009/0283787 A1* 11/2009 Donofrio .............. H01L 33/405
257/98

FOREIGN PATENT DOCUMENTS

| TW | 200837988 | 9/2008 |
| TW | 201104913 | 2/2011 |
| TW | I389355 | 3/2013 |
| TW | 201351701 | 12/2013 |
| TW | 201415670 | 4/2014 |
| TW | I437738 | 5/2014 |

* cited by examiner

Primary Examiner — Daniel Whalen (57) ABSTRACT

A light-emitting element is provided, including: a light-emitting unit sequentially comprising a first-type semiconductor layer, a light-emitting layer and a second-type semiconductor layer, wherein the light-emitting unit has an opening through the second-type semiconductor layer and the light-emitting layer to expose a portion of the first-type semiconductor layer; a current-conduction layer disposed on the second-type semiconductor layer; a first electrode disposed on the current-conduction layer and exposing a portion thereof; a distributed Bragg reflector disposed on the first electrode and covering the exposed portion of the current-conduction layer; and a second electrode disposed on the distributed Bragg reflector and filling the opening to electrically connect to the first-type semiconductor layer.

18 Claims, 7 Drawing Sheets

LIGHT-EMITTING ELEMENT AND LIGHT-EMITTING DEVICE CONTAINING THE SAME

CROSS REFERENCE TO RELATED APPLICATIONS

This application claims priority of Taiwan Patent Application No. 104121808, filed on Jul. 6, 2015, the entirety of which is incorporated by reference herein.

TECHNICAL FIELD

The present invention relates to a light-emitting element, and in particular it relates to a light-emitting diode (LED).

BACKGROUND

A light-emitting diode is a type of semiconductor device that emits light when voltage is applied to it. Nitride light-emitting diodes commonly serve as semiconductor optical elements emitting blue or green light. When the lattice match of compounds is taken into consideration, nitride semiconductor crystals are generally grown on the sapphire substrate, and then the electrode structure is formed to create a nitride light-emitting diode. However, the sapphire substrate has high rigidity, low heat conductivity, and low electrical conductivity, and the electrostatic problem thereof is also a primary factor that restricts the heat dissipation of original LED chips. Moreover, in original LED chip structures, the electrode will shield a portion of light and thus the light-emitting efficiency will be decreased. Therefore, the flip chip LED structure was gradually developed.

Nowadays, inverting a prepared LED chip and then soldering it onto a package substrate is a common technique for producing flip chip LEDs. Since the chip is inverted, heat may be conducted from the semiconductor layer directly to the package substrate, thereby preventing problems caused by poor heat dissipation of the sapphire substrate. Additionally, in flip chip structures, the sapphire substrate is inverted so as to be located at the upward light-emitting surface. Since the sapphire substrate is transparent, the problem of light being shielded by electrodes may be solved.

Due to the advantages described above, flip chip LEDs have attracted increasing attention in the industry. There are more and more LED manufacturers devoting their efforts to the technical field of flip chip LEDs, with expectations of improving related techniques or reducing costs so as to speed up the development of flip chip LEDs in the semiconductor industry.

BRIEF SUMMARY OF THE DISCLOSURE

An embodiment of the present invention provides a light-emitting element, comprising: a light-emitting unit sequentially comprising a first-type semiconductor layer, a light-emitting layer and a second-type semiconductor layer, wherein the light-emitting unit has an opening through the second-type semiconductor layer and the light-emitting layer to expose a portion of the first-type semiconductor layer; a current-conduction layer disposed on the second-type semiconductor layer; a first electrode disposed on the current-conduction layer and exposing a portion thereof; a distributed Bragg reflector disposed on the first electrode and covering the exposed portion of the current-conduction layer; and a second electrode disposed on the distributed Bragg reflector and filling the opening to electrically connect the first-type semiconductor layer.

In accordance with an embodiment of the present invention, in the light-emitting element described above, the first electrode surrounds the opening.

In accordance with another embodiment of the present invention, in the light-emitting element described above, the first electrode has a circular enclosed structure.

In accordance with a further embodiment of the present invention, in the light-emitting element described above, the first electrode has a grid structure.

DETAILED DESCRIPTION

The present invention can be more fully understood by reading the subsequent detailed description and examples with references made to the accompanying drawings. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

It should be appreciated that specific examples of components and arrangements are described below to simplify the present invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact.

Moreover, according to common practice, the various features of the drawings are not necessarily to scale. On the contrary, the dimensions of the various features are arbitrarily expanded or reduced for clarity. In addition, the present invention may repeat reference numerals and/or letters in the various examples. This repetition is for the purpose of simplicity and clarity and does not in itself dictate a relationship between the various embodiments and/or configurations discussed.

Figure 1:
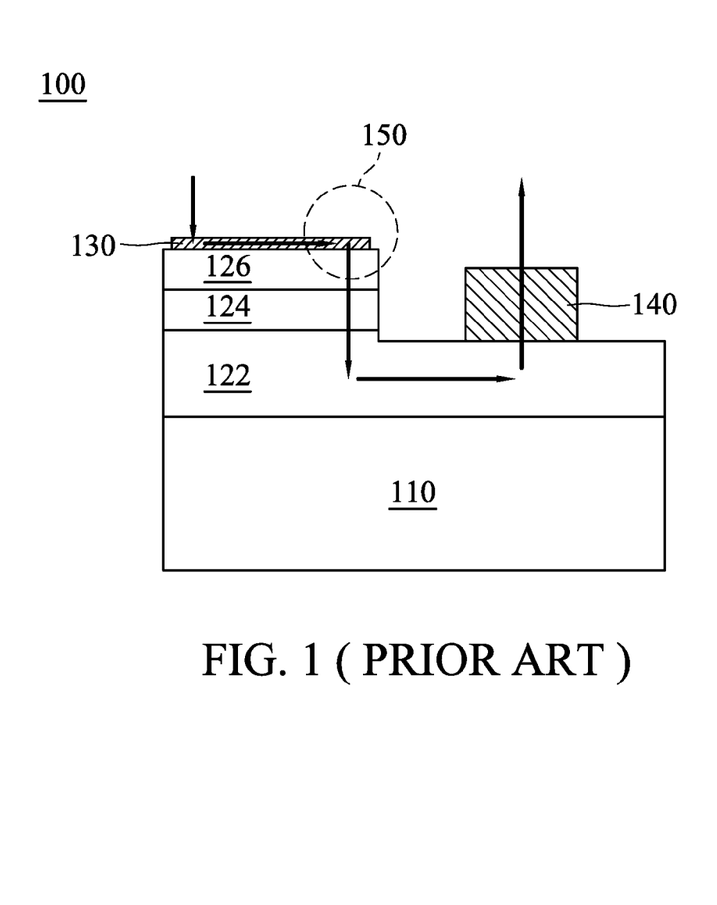
FIG. 1 illustrates a cross-sectional view of a light-emitting element.

FIG. 1 illustrates a cross-sectional view of a light-emitting element which is known to the inventor. In FIG. 1, the light-emitting diode 100 includes a sapphire substrate 110, and an n-type doped nitride semiconductor layer 122, a light-emitting layer 124 and a p-type doped nitride semiconductor layer 126, which are sequentially formed on the sapphire substrate 110. The light-emitting diode 100 also includes a p-electrode 130 formed on the p-type doped nitride semiconductor layer 126, and an n-electrode 140 formed on the n-type doped nitride semiconductor layer 122. For flip nitride semiconductor LEDs, it is generally desirable that the p-electrode of the flip chip possesses high reflectivity so as to reflect the light emitted from the light-emitting layer. Therefore, as shown in FIG. 1, a metal layer is deposited on the p-type doped nitride semiconductor layer 126 to serve as the p-electrode 130 and the reflective material of the light-emitting diode 100. However, the inventor found out that in such structures, since the p-electrode relies on the metal electrode to diffuse current and the n-electrode relies on n-type doped nitride semiconductor to diffuse current, the conductivity of each is very different, which causes a current-crowding effect while the element is in use.

In more detail, after voltage is applied to the light-emitting diode 100, the current will flow in a pathway as indicated by the arrow, from the p-electrode 130 sequentially through the p-type doped nitride semiconductor layer 126, the light-emitting layer 124 and the n-type doped nitride semiconductor layer 122, and conduct to the n-electrode 140 via the n-type doped nitride semiconductor layer 122. Since the conductivity of the metal layer of the p-electrode 130 and that of the n-type doped nitride semiconductor layer 120 are extremely different, the current-crowding effect occurs at the side of the p-electrode 130 which is close to the n-electrode 140 (area 150 as indicated by the dashed circle). This current-crowding effect may result in an increase of positive voltage, and meanwhile, due to non-uniform current distributions, the light-emitting efficiency of the light-emitting layer is decreased. Moreover, the current assembly causes a large amount of heat to accumulate at the area 150, and thus notably decreases the reliability of LEDs.

In order to solve the problem described above, the present invention provides an improved nitride semiconductor LED. It adopts a current-conduction layer to assist current conduction of the p-electrode and a distributed Bragg reflector to serve as reflective materials to the replace light-reflecting function of the p-electrode, with the expectation of decreasing the current-crowding effect, and to achieve a lower positive voltage and a higher light-emitting efficiency.

Figure 2:
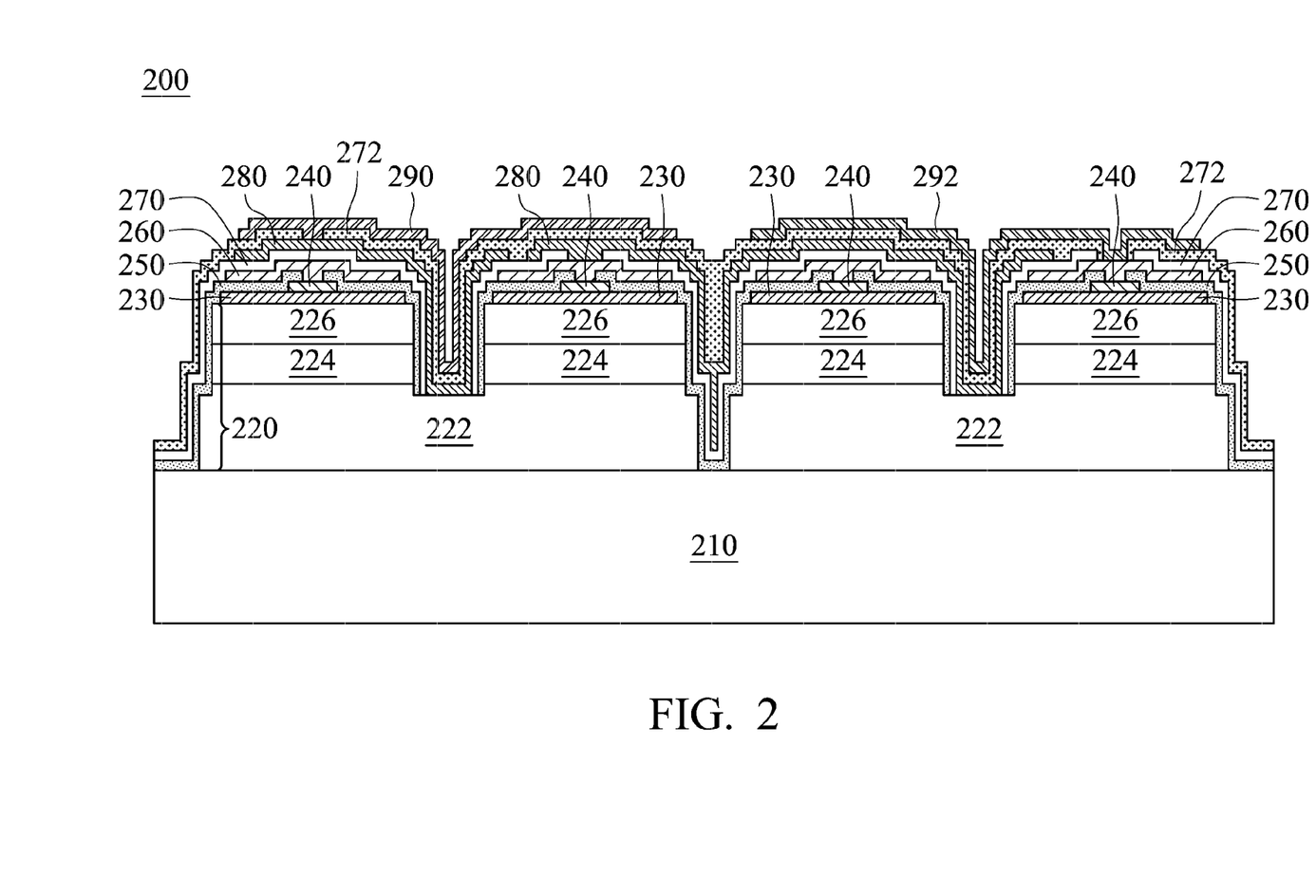
FIG. 2 is a cross-sectional view of a light-emitting element, in accordance with an embodiment of the present invention.
Figure 3A:
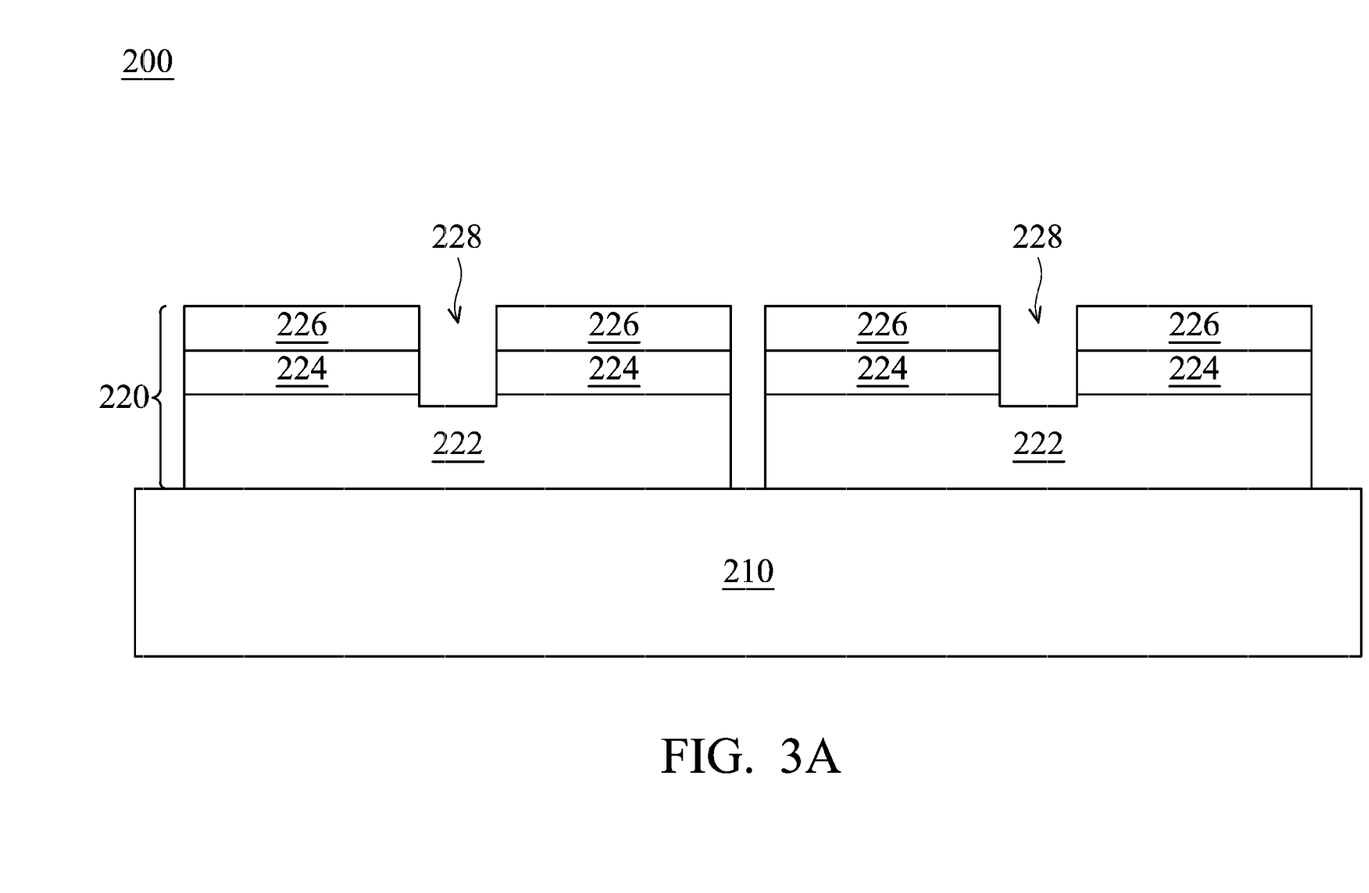
FIGS. 3A-3C are cross-sectional views of a light-emitting element during the manufacturing processes, in accordance with an embodiment of the present invention.
Figure 3B:
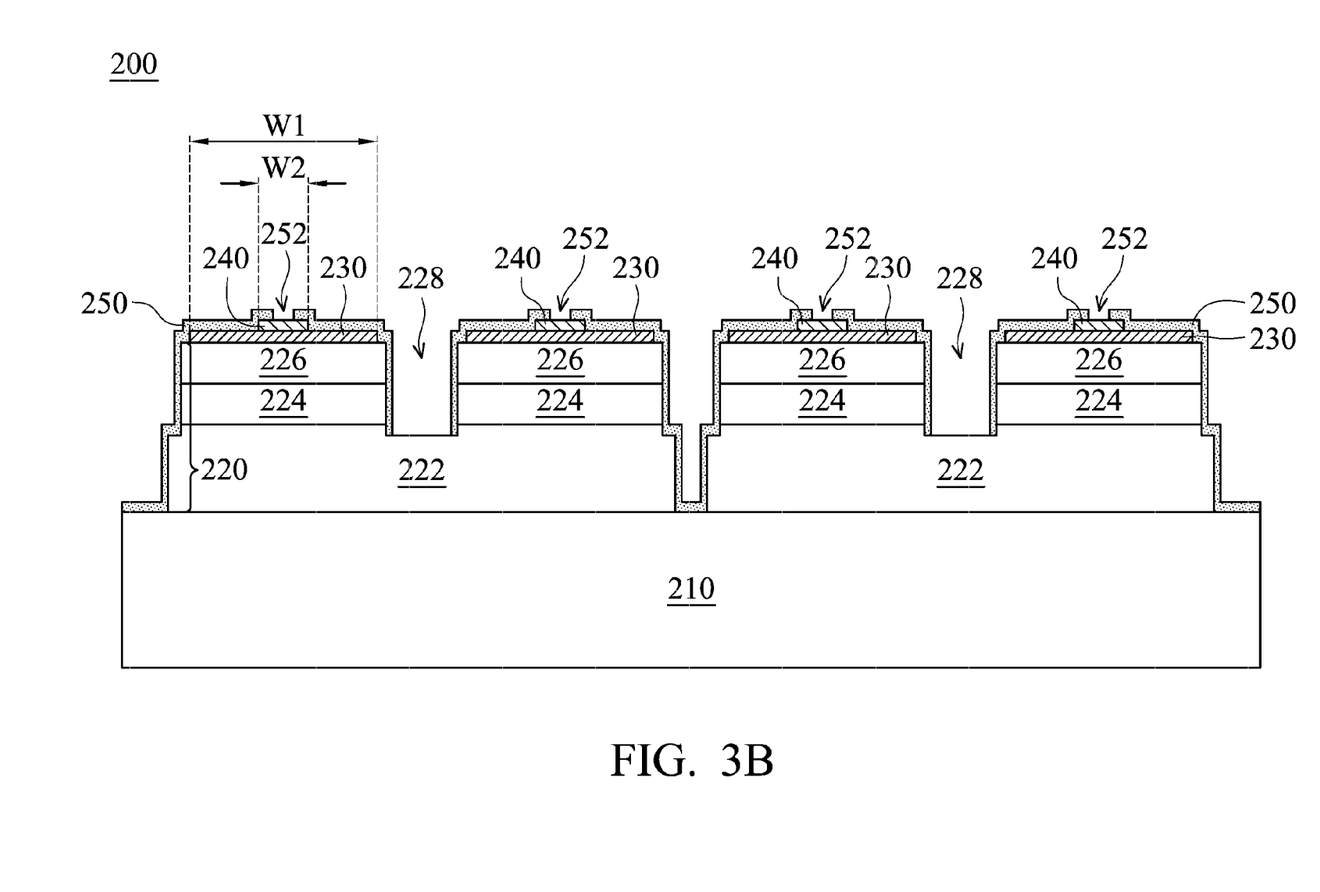
Figure 3C:
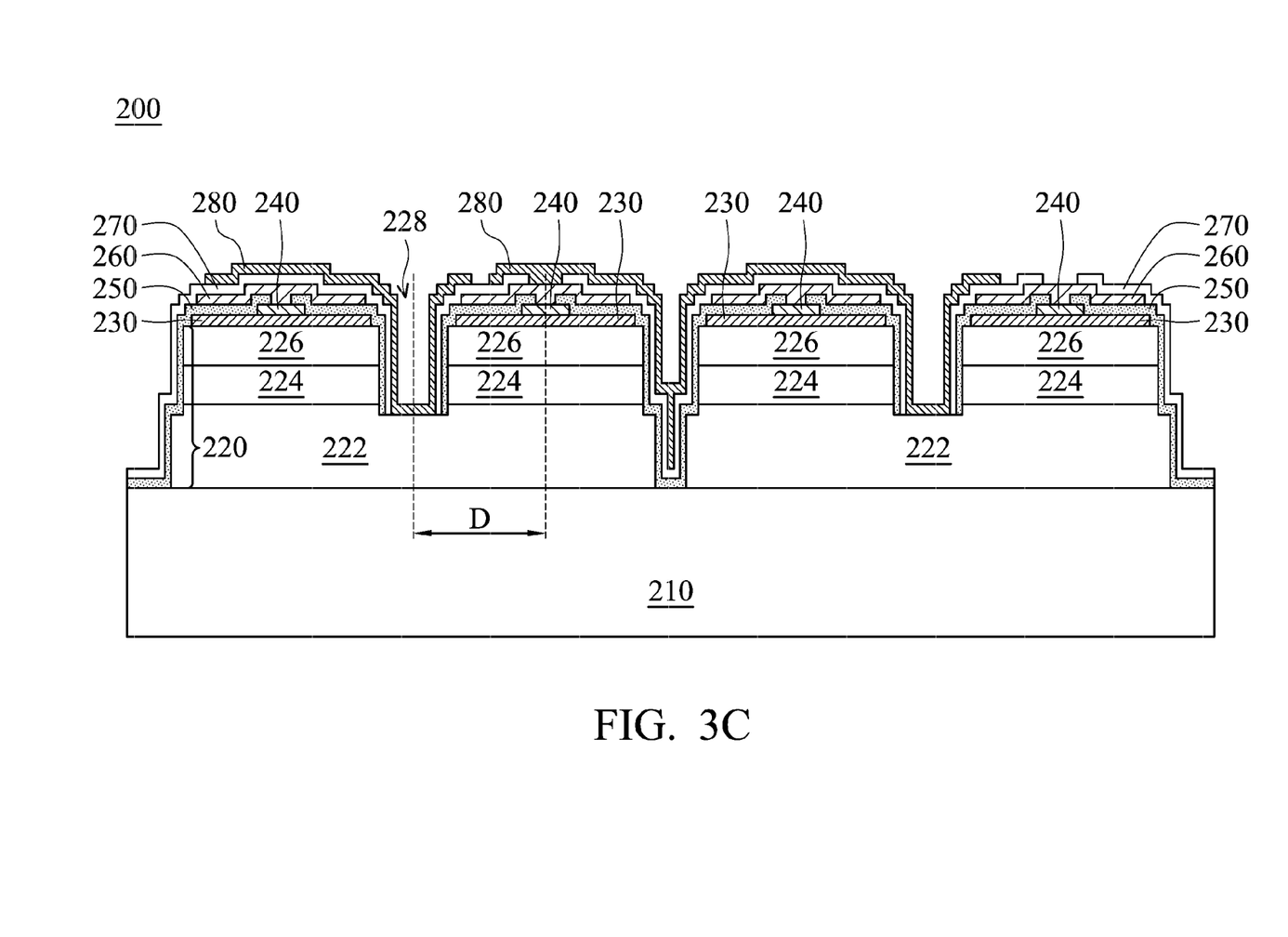

FIG. 2 illustrates a cross-sectional view of a light-emitting element 200, in accordance with an embodiment. FIGS. 3A-3C are cross-sectional views of a light-emitting element during manufacturing processes, in accordance with an embodiment. Accompanying with FIG. 2 and FIG. 3A-3C, the following illustrates the manufacturing method and the features of each structures of the light-emitting element 200. It should be noted that, any suitable method may be used to manufacture the light-emitting element 200. The following merely illustrates one embodiment of the manufacturing method of the light-emitting element 200, but is not limited thereto. Referring to FIG. 2, the light emitting-element 200 includes: a light-emitting unit 200, a current-conduction layer 230, a first electrode 240, a distributed Bragg reflector 250, a barrier layer 260, a first insulating layer 270, a second insulating layer 272, a second electrode 280 and a contact layer 290/292 and so on sequentially stacked on a substrate 210.

The manufacturing method of the light-emitting element 200 includes first forming a light-emitting unit 220 on the substrate 210. As shown in FIG. 3A, the light-emitting unit 220 includes a first-type semiconductor layer 222, a light-emitting layer 224 and a second-type semiconductor layer 226 sequentially formed on the substrate 210. The light-emitting unit 220 has an opening 228 through the second-type semiconductor layer 226 and the light-emitting layer 224 to expose a portion of the first-type semiconductor layer 222.

The substrate 210 may include sapphire substrates ($Al_2O_3$, Sapphire), silicon substrates or silicon carbide (SiC) substrates, and the substrate may be doped or non-doped.

Generally, the first-type semiconductor layer 222 and the second-type semiconductor layer 226 consist of III-V compounds having different types of dopants. For example, the first-type semiconductor layer 222 in the light-emitting unit 220 may be gallium nitride having n-type conductivity (n-GaN) and the second-type semiconductor layer 226 may be gallium nitride having p-type conductivity (p-GaN). Other III-V compounds may be used, such as indium nitride (InN), aluminum nitride (AlN), indium gallium nitride ($In_xGa_{(1-x)}N$), aluminum gallium nitride ($Al_xGa_{(1-x)}N$) or aluminum indium gallium nitride ($Al_xIn_yGa_{(1-x-y)}N$) etc., wherein $0<x\le1$, $0<y\le1$ and $0\le x+y\le1$.

In some embodiments, the first-type semiconductor layer 222, the light-emitting layer 224 and the second-type semiconductor layer 226 may be formed by an epitaxial growth process; for example, metal organic chemical vapor deposition (MOCVD), molecular beam epitaxy (MBE), hydride vapor phase epitaxy (HPVE), liquid phase epitaxy (LPE), or another suitable chemical vapor deposition process. In one embodiment, lithography and etching processes may be used to form the opening 228 in the light-emitting unit 220.

Referring to FIG. 3B, after the light-emitting unit 220 is formed, the current-conduction layer 230, the first electrode 240 and the distributed Bragg reflector 250 are sequentially formed on the light-emitting unit 220, wherein the current-conduction layer 230 is formed on the second-type semiconductor layer 226. The first electrode 240 is located on the current-conduction layer 230 and exposes a portion of the current-conduction layer 230; that is, a cross-section width W2 of the first electrode 240 is smaller than a cross-section width W1 of the current-conduction layer 230. The distributed Bragg reflector 250 is formed on the first electrode 240 and covers the exposed portion of the current-conduction layer 230. The distributed Bragg reflector 250 partially overlaps the first electrode 240, and has an opening 252 to expose a portion of the first electrode 240. In one embodiment, the distributed Bragg reflector 250 is further formed on the sidewall of the opening 228.

As shown in FIG. 3B, in the present invention, the first electrode 240 having a smaller cross-section width is disposed such that it is away from the subsequently formed second electrode 280 (referring to the later discussion of FIG. 3C), and the current-conduction layer 230 is formed by using the materials having similar conductivity to the second-type semiconductor layer 226 to assist lateral current conduction. Thereby, current-crowding effects are reduced efficiently.

Still referring to FIG. 3B, in the present invention, the distributed Bragg reflector 250 is further disposed to reflect the light emitted from the light-emitting layer, wherein the distributed Bragg reflector 250 partially overlaps on the first electrode 240 to form a continuous mirror. It may replace the p-electrode in the known structure, which serve as a reflective layer, and efficiently reflect the light emitted from the light-emitting layer.

The material of the current-conduction layer 230 may be any conductive material having a similar conductivity to the second-type semiconductor layer 226. In one embodiment, the material of the current-conduction layer 230 may include transparent conductive oxides (TCO). For example, the material of the current-conduction layer 230 may include indium tin oxide (ITO).

In one embodiment, the material of the first electrode 240 may include metals. For example, metallic materials of the first electrode 240 may include, but is not limited to, Cu, Al, In, Sn, Au, Pt, Zn, Ag, Ti, Ni or a combination thereof.

The distributed Bragg reflector 250 may be a monolayer or multilayer structure. In one embodiment, the distributed Bragg reflector 250 may include a periodical structure, which is formed by the alternative arrangement of two kinds of material layers having different refractive indexes, or a dielectric waveguide, whose effective refractive index has a periodical variation. In one embodiment, the material of the distributed Bragg reflector 250 may include insulators. For example, the material of the distributed Bragg reflector 250 may include, but is not limited to, $SiO_2$, $TiO_2$, $Ta_2O_5$, $Al_2O_3$ or $Si_3N_4$.

The current-conduction layer 230, the first electrode 240 and the distributed Bragg reflector 250 may be formed by depositing the desired materials followed by patterning. For example, the deposition method for forming the current-conduction layer 230 and the first electrode 240 may include physical vapor deposition (PVD), sputtering, E-Gun evaporation, chemical vapor deposition (CVD), atomic layer deposition (ALD), or another suitable process. The deposition method for forming the distributed Bragg reflector 250 may include sputtering, E-Gun evaporation, spin coating, chemical vapor deposition (CVD), plasma-enhanced chemical vapor deposition (PECVD), low-pressure chemical vapor deposition, (LPCVD) or another suitable process. For example, the current-conduction layer 230, the first electrode 240 and the distributed Bragg reflector 250 may be patterned by photolithography and etching processes.

After the distributed Bragg reflector 250 is formed, the second electrode 280 is formed on the distributed Bragg reflector 250. Referring to FIG. 3C, the second electrode 280 is formed on the distributed Bragg reflector 250 and fills in the opening 228 to electrically connect to the first-type semiconductor layer 222.

As described above, compared with the LED structure in FIG. 1, since the LED structure of the present invention conducts current laterally via the current-conduction layer 230, the first electrode 240 may have a smaller cross-section width, and thus expands the distance between the first electrode 240 and the second electrode 280 so as to prevent current crowding. In one embodiment, the distance D between the first electrode 240 and the opening 228 is about 50 to 250 μm.

Figure 4:
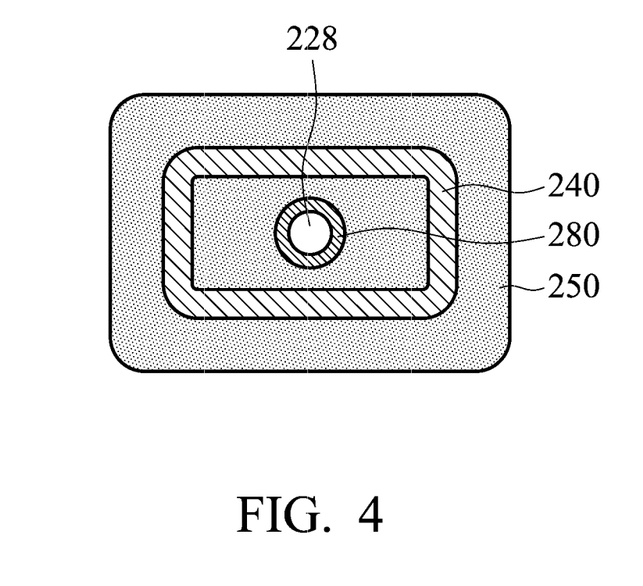
FIG. 4 is a top view of a light-emitting element, in accordance with an embodiment of the present invention.
Figure 5:
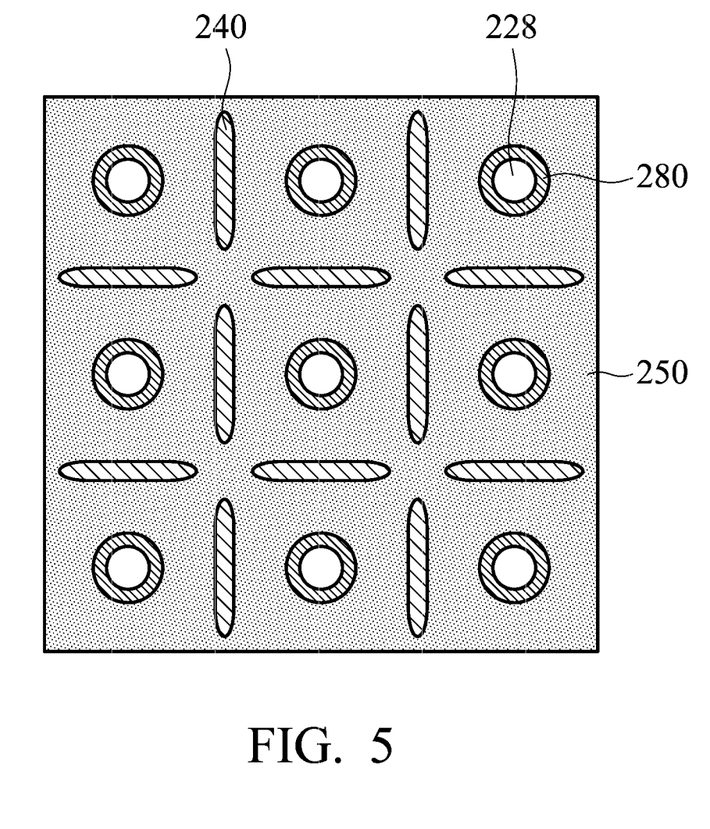
FIG. 5 is a top view of a light-emitting element, in accordance with another embodiment of the present invention.

Moreover, from the top view, the first electrode 240 is disposed to surround the second electrode 280 to achieve the effects of mirror maximization and uniform current distribution. According to the concept that the first electrode surrounds the second electrode, various arrangements of the electrode structures may be designed. For example, referring to FIGS. 4-5, they illustrate top views of the electrode structures obtained from using the first electrode 240 as a datum, in accordance with some embodiments (for clarity, parts of the features are not depicted accordingly). In one embodiment, as shown in FIG. 4, in the top view obtained from using the first electrode 240 as a datum, the first electrode 240 surrounds the second electrode 280 and the first electrode 240 may have a circular enclosed structure. In another embodiment, as shown in FIG. 5, for the LED structure having a larger area, a plurality of second electrodes 280 may be disposed and the first electrode 240 may separate these second electrodes 280 in a grid structural or a grating structural manner such that the first electrode 240 is disposed between any two of the second electrodes 280.

In one embodiment, the material of the second electrode 280 may include metals. For example, metallic materials of the second electrode 280 may include, but are not limited to, Cu, Al, In, Sn, Au, Pt, Zn, Ag, Ti, Ni or a combination thereof.

Referring to FIG. 3C, in one embodiment, before the second electrode 280 is formed, the barrier layer 260 and the first insulating layer 270 may be sequentially formed between the distributed Bragg reflector 250 and the second electrode 280 as needed. That is, before the second electrode 280 is formed, the barrier layer 260 is formed on the distributed Bragg reflector 250 and fills the opening 252 to connect with the first electrode 240 through the distributed Bragg reflector 250. The first insulating layer 270 is conformally formed on the sidewalls of the distributed Bragg reflector 250, the barrier layer 260 and the opening 228, and in the opening 228. In one embodiment, the first insulating layer 270 is located between the barrier layer 260 and the second electrode 280, and between the distributed Bragg reflector 250 and the second electrode 280.

The barrier layer 260 may be electrically conductive and may prevent metals of the first electrode 240 form diffusing to other layers. For example, the material of the barrier layer 260 may include, but is not limited to, Ta, TaN, Ti, TiN, Co, W or a combination thereof. The first insulating layer 270 may be used at certain places to isolate the barrier layer 260 and the second electrode 280 to make them electrically insulating. For example, the material of the first insulating layer 270 may include, but is not limited to, silicon nitrides, oxynitrides or a combination thereof.

Similarly, the barrier layer 260, the first insulating layer 270 and the second electrode 280 may be formed by depositing the desired materials followed by patterning. For example, the deposition method for forming the barrier layer 260 and the second electrode 280 may include physical vapor deposition (PVD), sputtering, E-Gun evaporation, chemical vapor deposition (CVD), atomic layer deposition (ALD), or another suitable process. The deposition method for forming the first insulating layer 270 may include spin coating, thermal oxidation, physical vapor deposition (PVD), chemical vapor deposition (CVD), or another suitable process. For example, the barrier layer 260, the first insulating layer 270 and the second electrode 280 may be patterned by photolithography and etching processes.

Finally, referring again to FIG. 2, if needed, the second insulating layer 272 and the contact layer 290/292 may be formed sequentially on the second electrode 280 to complete the light-emitting element 200. In more detail, the second insulating layer 272 is formed on the second electrode 280 to protect the layers underneath. According to the element design as needed, the contact layer 290/292 may pass through the second insulating layer 272 to electrically connect to the first electrode 240 or the second electrode 280 and form the distribution lines. For example, the contact layer 290 may pass through the second insulating layer 272 to electrically connect to the second electrode 280, and the contact layer 290 may pass through the second insulating layer 272 to electrically connect to the first electrode 240.

The second insulating layer 272 may be formed by the same materials and processes used in the first insulating layer 270, the descriptions of which will not be repeated herein. The contact layer 290/292 may be formed by the same material or different materials. In one embodiment, the material of the contact layer 290/292 may include metals. For example, the metallic materials of the contact layer 290/292 may respectively include, but is not limited to, Cu, Al, In, Sn, Au, Pt, Zn, Ag, Ti, Ni or a combination thereof. The contact layer 290/292 may be formed by depositing the desired materials followed by patterning. For example, the deposition method for forming the contact layer 290/292 may include physical vapor deposition (PVD), sputtering, E-Gun evaporation, chemical vapor deposition (CVD), atomic layer deposition (ALD), or another suitable process. For example, the contact layer 290/292 may be patterned by photolithography and etching processes.

The present invention further provides a light-emitting device, which includes the plurality of light-emitting elements described in the present invention, and these light-emitting elements are electrically connected to each other. For example, the light-emitting device described in the present invention is formed by a plurality of light-emitting elements 200 which are connected in series.

To summarize the above, in the light-emitting element of the present invention, the p-electrode having a smaller cross-section width is disposed, and the current-conduction layer and the distributed Bragg reflector are respectively disposed to provide functions that assist in current conduction and light reflection, and this effectively solves the technical problem of current crowding.

While the disclosure has been described by way of example and in terms of the preferred embodiments, it is to be understood that the disclosure is not limited to the disclosed embodiments. Those skilled in the art may make various changes, substitutions, and alterations herein without departing from the spirit and scope of the present disclosure. The appended claims are intended to cover all such modifications which may fall within the spirit and scope of the disclosure.

What is claimed is:

1. A light-emitting element, comprising:
   a light-emitting unit sequentially comprising a first-type semiconductor layer, a light-emitting layer and a second-type semiconductor layer, wherein the light-emitting unit has an opening through the second-type semiconductor layer and the light-emitting layer to expose a portion of the first-type semiconductor layer;
   a current-conduction layer disposed on the second-type semiconductor layer;
   a first electrode disposed on the current-conduction layer and exposing a portion thereof;
   a distributed Bragg reflector disposed on the first electrode and covering the exposed portion of the current-conduction layer;
   a second electrode disposed on the distributed Bragg reflector and filling the opening to electrically connect to the first-type semiconductor layer; and
   a barrier layer disposed on the distributed Bragg reflector and through the distributed Bragg reflector to connect to the first electrode.

2. The light-emitting element as claimed in claim 1, wherein the first electrode surrounds the opening.

3. The light-emitting element as claimed in claim 2, wherein the first electrode has a circular enclosed structure.

4. The light-emitting element as claimed in claim 2, wherein the first electrode has a grid structure.

5. The light-emitting element as claimed in claim 1, wherein a distance between the first electrode and the opening is about 50-250 μm.

6. The light-emitting element as claimed in claim 1, wherein the distributed Bragg reflector is disposed on a sidewall of the opening.

7. The light-emitting element as claimed in claim 1, further comprising:
   an insulating layer disposed between the barrier layer and the second electrode, and between the distributed Bragg reflector and the second electrode.

8. The light-emitting element as claimed in claim 1, wherein the material of the distributed Bragg reflector is an insulator.

9. The light-emitting element as claimed in claim 1, wherein the material of the current-conduction layer is indium tin oxide.

10. A light-emitting device, comprising:
    a plurality of light-emitting elements, wherein the plurality of light-emitting elements are electrically connected to each other, and one of the plurality of light-emitting elements comprises:
       a light-emitting unit sequentially comprising a first-type semiconductor layer, a light-emitting layer and a second-type semiconductor layer, wherein the light-emitting unit has an opening through the second-type semiconductor layer and the light-emitting layer to expose a portion of the first-type semiconductor layer;
       a current-conduction layer disposed on the second-type semiconductor layer;
       a first electrode disposed on the current-conduction layer and exposing a portion thereof;
       a distributed Bragg reflector disposed on the first electrode and covering the exposed portion of the current-conduction layer;
       a second electrode disposed on the distributed Bragg reflector and filling the opening to electrically connect to the first-type semiconductor layer; and
       a barrier layer disposed on the distributed Bragg reflector and through the distributed Bragg reflector to connect to the first electrode.

11. The light-emitting device as claimed in claim 10, wherein the first electrode surrounds the opening.

12. The light-emitting device as claimed in claim 11, wherein the first electrode has a circular enclosed structure.

13. The light-emitting device as claimed in claim 11, wherein the first electrode has a grid structure.

14. The light-emitting device as claimed in claim 10, wherein a distance between the first electrode and the opening is about 50-250 μm.

15. The light-emitting device as claimed in claim 10, wherein the distributed Bragg reflector is disposed on a sidewall of the opening.

16. The light-emitting device as claimed in claim 10, further comprising:
    an insulating layer disposed between the barrier layer and the second electrode, and between the distributed Bragg reflector and the second electrode.

17. The light-emitting device as claimed in claim 10, wherein the material of the distributed Bragg reflector is an insulator.

18. The light-emitting device as claimed in claim 10, wherein the material of the current-conduction layer is indium tin oxide.

* * * * *